(12) United States Patent
Yeh et al.

(10) Patent No.: US 8,910,101 B1
(45) Date of Patent: Dec. 9, 2014

(54) SYSTEMS AND METHODS FOR DETERMINING EFFECTIVE CAPACITANCE TO FACILITATE A TIMING ANALYSIS

(71) Applicant: Taiwan Semiconductor Manufacturing Co., Ltd., Hsin-Chu (TW)

(72) Inventors: Chao-Yang Yeh, Luzhou (TW); Cheng-Hung Yeh, Jhunan Township (TW); Chi-Ting Huang, Hsinchu (TW)

(73) Assignee: Taiwan Semiconductor Manfacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/051,522

(22) Filed: Oct. 11, 2013

(51) Int. Cl.
G06F 17/50 (2006.01)
(52) U.S. Cl.
CPC ........ G06F 17/5081 (2013.01); G06F 17/5031 (2013.01)
USPC ............................................. 716/115; 716/113
(58) Field of Classification Search
CPC ....................................... G06F 17/50–17/5081
See application file for complete search history.

(56) References Cited

U.S. PATENT DOCUMENTS

| | | | |
|---|---|---|---|
| 6,721,929 B2 | 4/2004 | Li | |
| 6,725,185 B2 | 4/2004 | Clement | |
| 7,082,587 B2 | 7/2006 | Chen | |
| 2001/0029601 A1 | 10/2001 | Kimura et al. | |
| 2002/0021135 A1 | 2/2002 | Li | |
| 2003/0208346 A1 | 11/2003 | Huang | |
| 2010/0094609 A1* | 4/2010 | Han et al. | 703/14 |
| 2010/0199236 A1 | 8/2010 | Chen et al. | |
| 2010/0257495 A1 | 10/2010 | Wu | |
| 2011/0084358 A1* | 4/2011 | Kim et al. | 257/531 |
| 2011/0168995 A1* | 7/2011 | Doong et al. | 257/48 |
| 2012/0221990 A1* | 8/2012 | Dai et al. | 716/112 |
| 2013/0007692 A1 | 1/2013 | Yeh et al. | |
| 2013/0032799 A1* | 2/2013 | Yen et al. | 257/48 |
| 2013/0227501 A1* | 8/2013 | Yang et al. | 716/102 |
| 2013/0246990 A1* | 9/2013 | Yen et al. | 716/112 |
| 2014/0082578 A1* | 3/2014 | Wu et al. | 716/115 |

OTHER PUBLICATIONS

Ji, H. et al., "RC Extraction and Timing Analysis with On-Chip Random Variations", Cadence Design Systems, Inc., 7 pages, Session No. 7.3, at http:/www.cdnusers.org/Portals/O/cdnlive/na2006/7.3/7.3_paper.pdf.
Sundaresan, K. , "StarRC Custom: Next-Generation Modeling and Extraction Solution for Custom IC Designs", May 2010, Synopsys Predictable Success, pp. 1-6.
Han, S. et al., "Performance Improvement of Resonant Inductive Coupling for Wireless 3D IC Interconnect", EECS Dept. Univ. of Michigan, Ann Arbor, MI, 2010 IEEE Jul. 11-17, 2010, pp. 1-4.

(Continued)

*Primary Examiner* — Leigh Garbowski
(74) *Attorney, Agent, or Firm* — Duane Morris LLP

(57) ABSTRACT

A method for determining an effective capacitance to facilitate a timing analysis using a processor generally comprises generating a model that is representative of a coupling between at least two TSVs. An impedance profile between the two TSVs as a function of at least one parameter is determined by using the model, wherein the impedance profile includes a plurality of impedance values corresponding to respective values of the parameter. An effective capacitance value corresponding to each respective impedance value is determined. An RC extraction is conducted of a design layout of a TSV circuit based on each determined effective capacitance value to generate an RC network.

20 Claims, 11 Drawing Sheets

(56) References Cited

OTHER PUBLICATIONS

Yoon, K. et al., "Modeling and Analysis of Coupling between TSVs, Metal, and RDL interconnects in TSV-basaed 3D IC with Silicon Interposer", 2009 11th Electronics Packaging Technology Conference, pp. 702-706.

Bermond, C., et al., "High Frequency Characterization and Modeling of High Density TSV in 3D Integrated Circuits", IEEE Workshop on Signal Propagation on Interconnects, SPI 2009, pp. 1-4.

* cited by examiner

SYSTEMS AND METHODS FOR DETERMINING EFFECTIVE CAPACITANCE TO FACILITATE A TIMING ANALYSIS

FIELD

The disclosed system and method relate to modeling and simulation tools for integrated circuits ("ICs") and, more particularly, to systems and methods for determining effective capacitance value(s) that can be used to facilitate a timing analysis for a design of an IC.

BACKGROUND

Integrated circuits ("ICs") are incorporated into many electronic devices. IC packaging has evolved, such that multiple ICs may be vertically stacked in so-called three-dimensional ("3D") packages in order to save horizontal area on a printed circuit board ("PCB"). 3D IC packages include the use of through substrate vias (TSV), also referred to as through-silicon-vias, in the case of silicon-based dies. The inclusion of TSV increases the complexity of semiconductor fabrication and packaging. For example, TSV-to-TSV coupling is an additional noise source for 3D IC packages.

The design process for a new IC includes several steps by using, for example, automated electronic design automation ("EDA") tools. The design process can include (1) determining an initial design of the IC and (2) generating a layout of the design. During the initial design, a user (of the EDA tool) or designer can identify a set of functions to include in the design, along with their standard delays. The user can also use computer implemented tools to perform functional simulation to ensure that the design can perform a pre-simulation process. If the design meets circuit performance requirements during the pre-simulation process, the user can then initiate floorplan and layout ("place and route") phases to generate an actual layout. Following the layout process, the user can verify the design by using the EDA tools to perform design rule checks ("DRC"), layout versus schematic ("LVS") checks, and RC extraction. The RC extraction tool takes into account the layout of the conductive (e.g., metal) lines of the interconnect layers generated by the router and computes parasitic resistance and capacitance elements associated with each conductive line. Then a post-simulation process verifies circuit performance and timing.

When considering a coupling between at least two TSVs during, for example, a small scale timing analysis, a network spice model can be used to simulate the coupling effect. When conducing, for example, a full-chip timing analysis, a static timing analysis ("STA") tool can be used. However, the STA tool facilitates a more restricted network style, wherein the coupling capacitance that is between different networks is considered. As such, the STA tool is unable to support a full-chip timing analysis.

DETAILED DESCRIPTION

Figure 1:
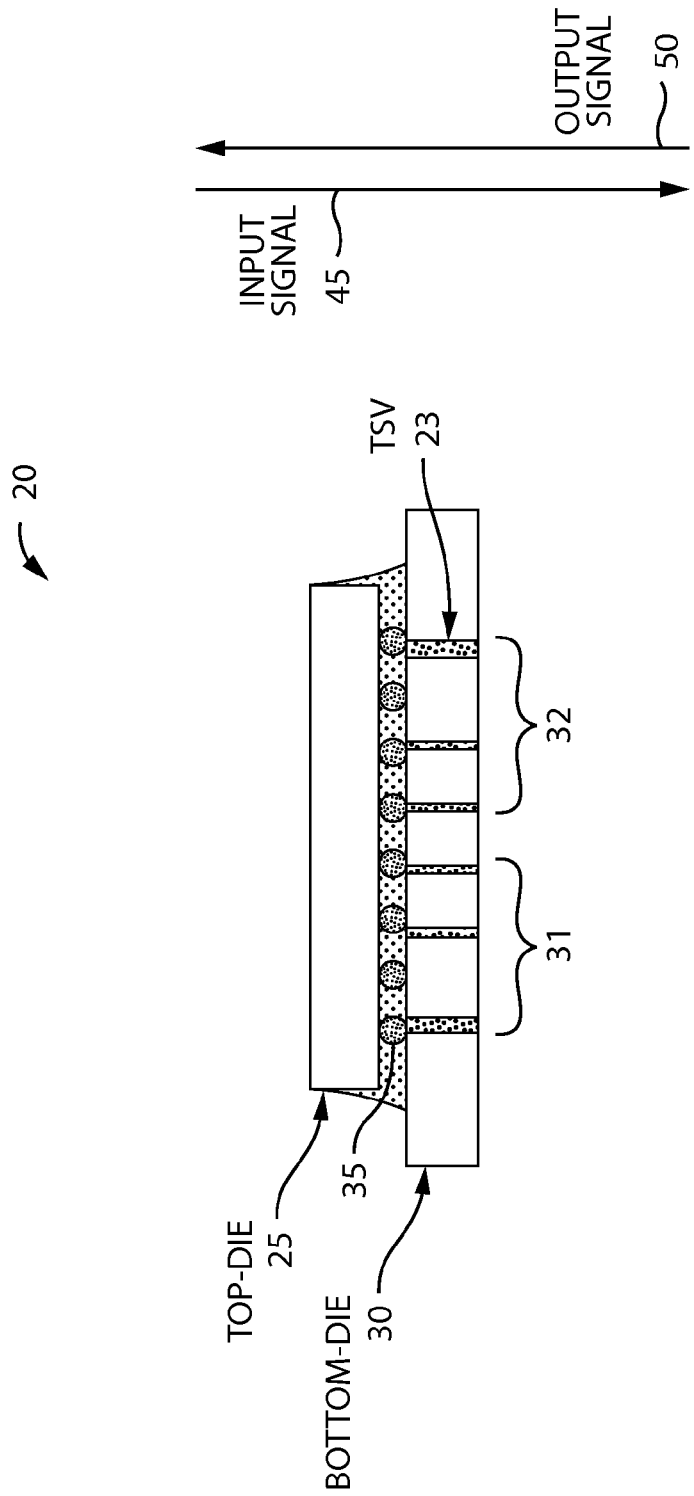
FIG. 1 is a diagram of a portion of an embodiment of a 3D IC.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Some embodiments of the system and method described herein facilitate a full-chip timing analysis by a static timing analysis ("STA") tool by using a modified design model of a coupling between at least two through substrate vias or two through silicon vias ("TSVs") of a three-dimensional ("3D") integrated circuit ("IC"). For example, in some embodiments, a network model that is representative of a coupling between at least two TSVs of 3D IC package is generated. Some embodiments of the system and method described herein facilitate a modification of the network model prior to an RC extraction such that a full-chip timing analysis can be supported by the STA tool. For example, in some embodiments, the network model is reduced to a simplified model, such that effective capacitance values can be determined. The effective capacitance is modeled as a single lumped capacitor which provides the same magnitude of impedance (between two adjacent TSVs) at each frequency of the network model. Thus, the magnitude of the effective capacitance takes into account any resistive and/or capacitive component of the impedance between the TSVs, and takes into account the network representing the coupling between TSVs in the network model. The effective capacitance values for a given TSV network can be tabulated and input to an STA tool, which accepts, as an input, a single capacitive coupling between TSVs.

An RC extraction is performed on a design layout of a TSV circuit based on the simplified model and the determined effective capacitance values. The results of the RC extraction can then be used for a full-chip timing analysis by the STA tool. By reducing or simplifying the design model, such that a simplified model can be used for the determination of effective capacitance values, a full-chip timing analysis can be supported by the STA tool.

FIG. 1 is a block diagram that illustrates a portion of an embodiment a 3D IC 20 having TSVs 23. 3D IC 20 includes a top die 25 and a bottom die 30 coupled together via an electrical coupling 35 and the TSVs 23. Signals being transmitted within 3D IC 20 include input signals 45 that are applied to the top die 25 and pass through to bottom die 30. Signals being transmitted within 3D IC 20 also include output signals 50 being applied to the bottom die 30 and pass through to top die 25. As described in more detail below with respect to the remaining figures, in some embodiments, a full-chip timing analysis of the signals moving from, for example, top die 25 to bottom die 30, can be analyzed by an STA tool (not shown in FIG. 1).

Figure 2:
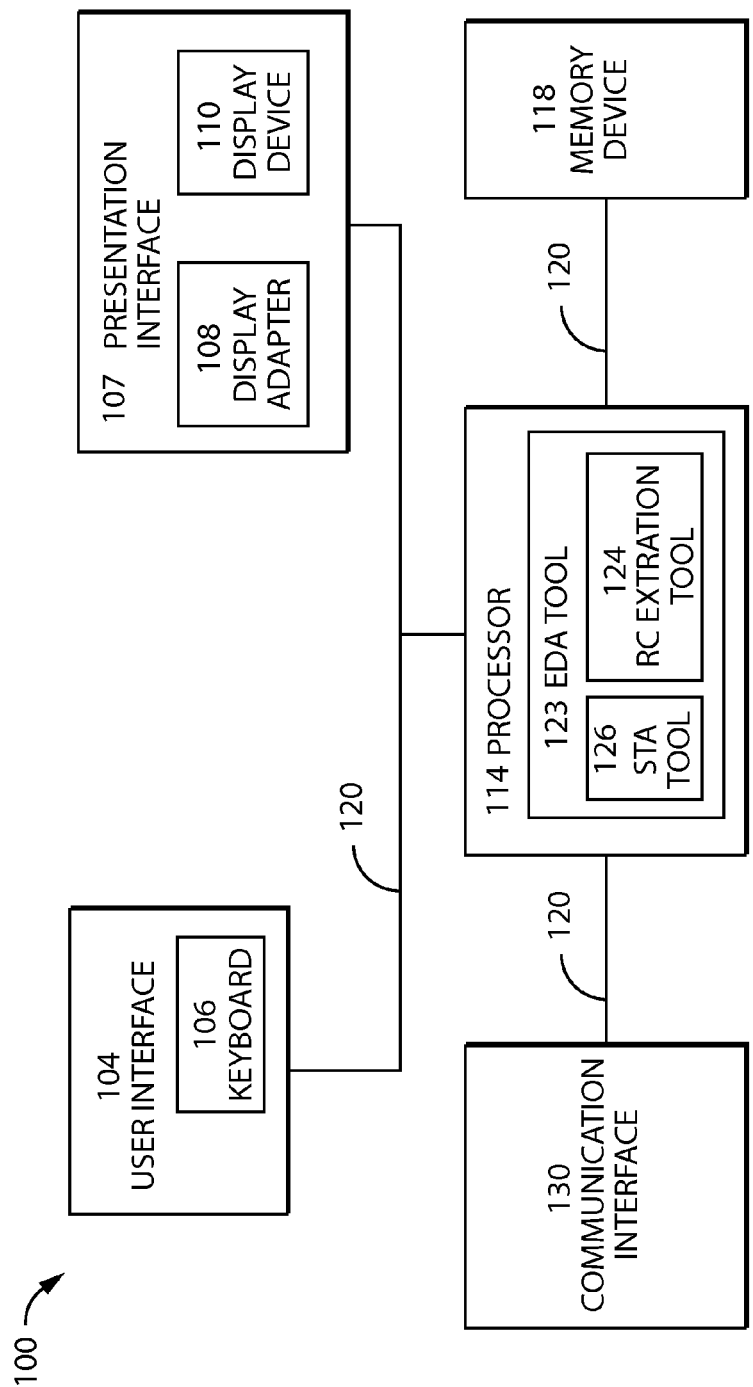
FIG. 2 is a block diagram of an embodiment of a system for modeling the 3D IC shown in FIG. 1.
Figure 3A:
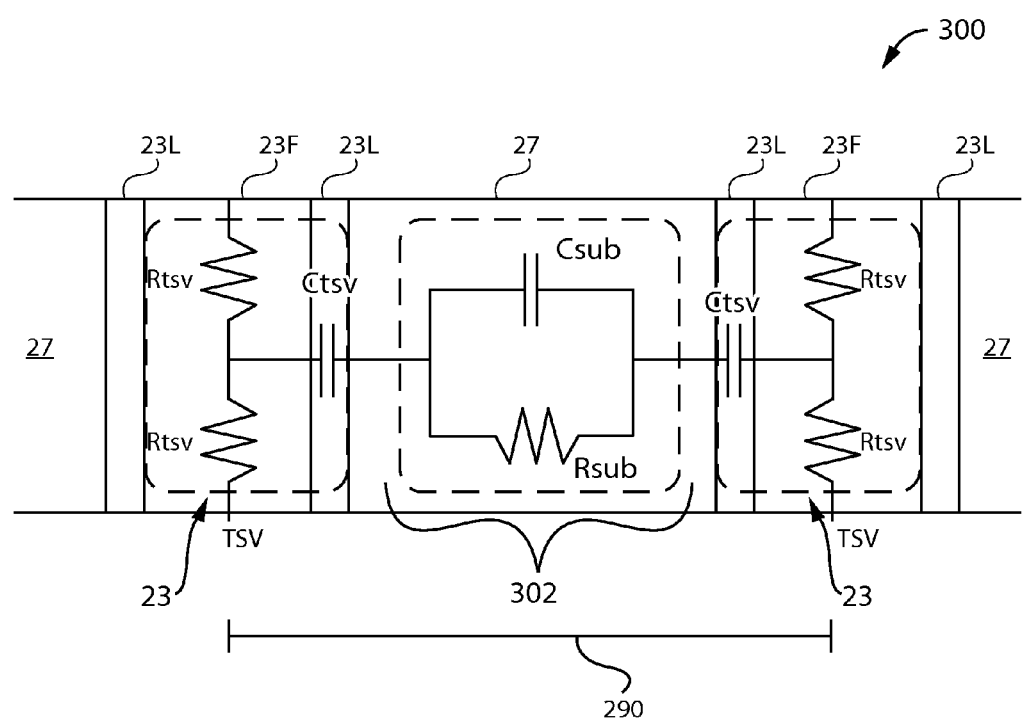
FIGS. 3A-3C are embodiments of TSV-to-TSV coupling models that are generated and used by the system shown in FIG. 2.
Figure 3B:
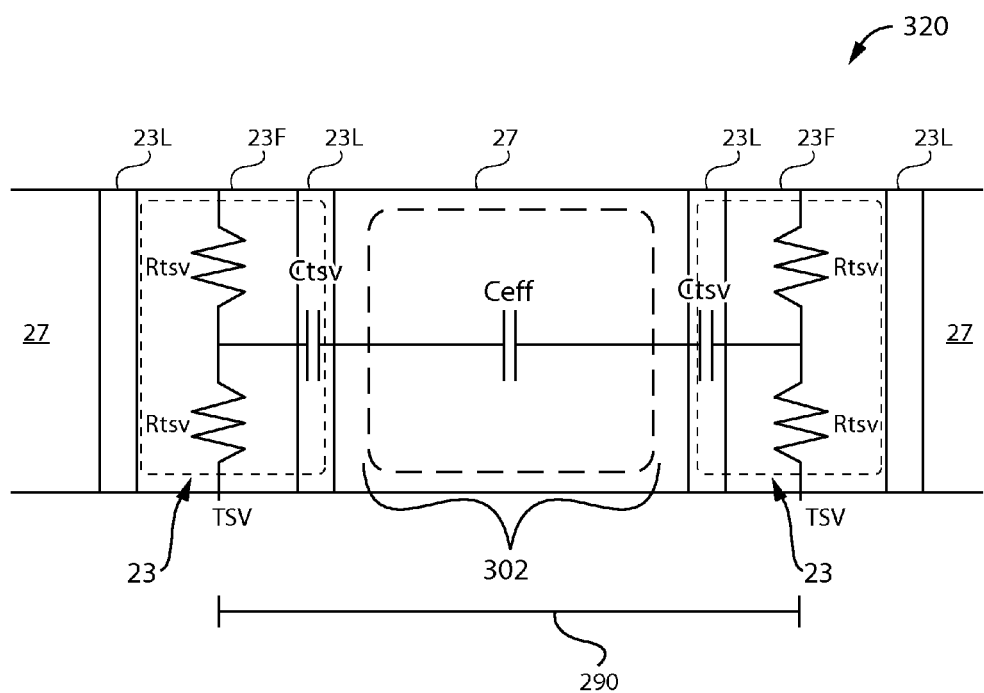
Figure 3C:
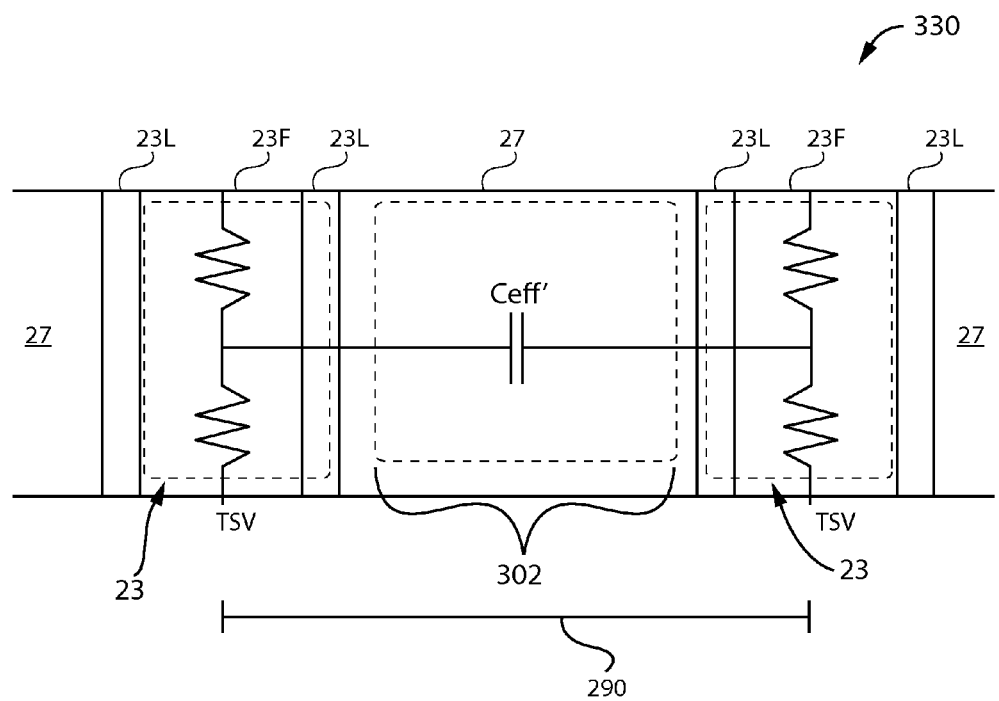
Figure 4A:
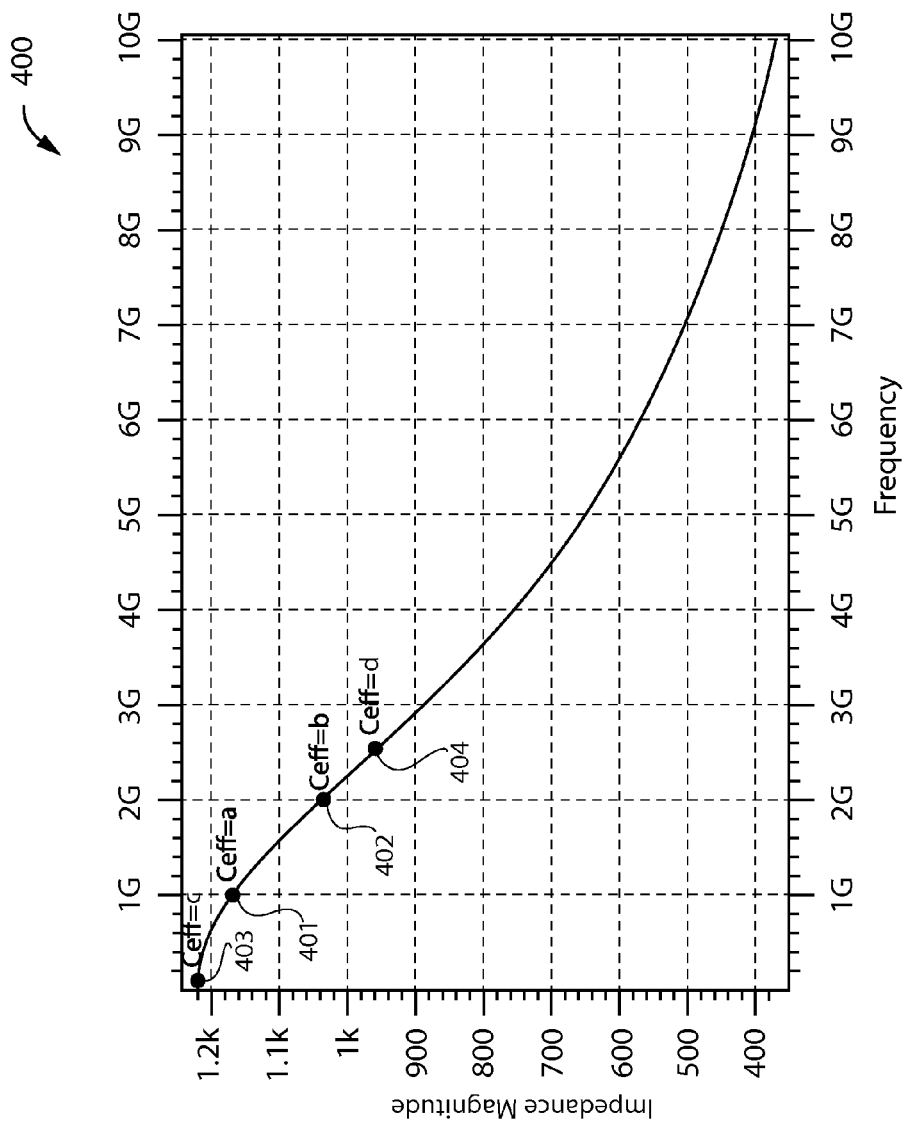
FIG. 4A is a graphical representation of an impedance profile generated and used by the system shown in FIG. 2, in accordance with an embodiment.
Figure 4B:
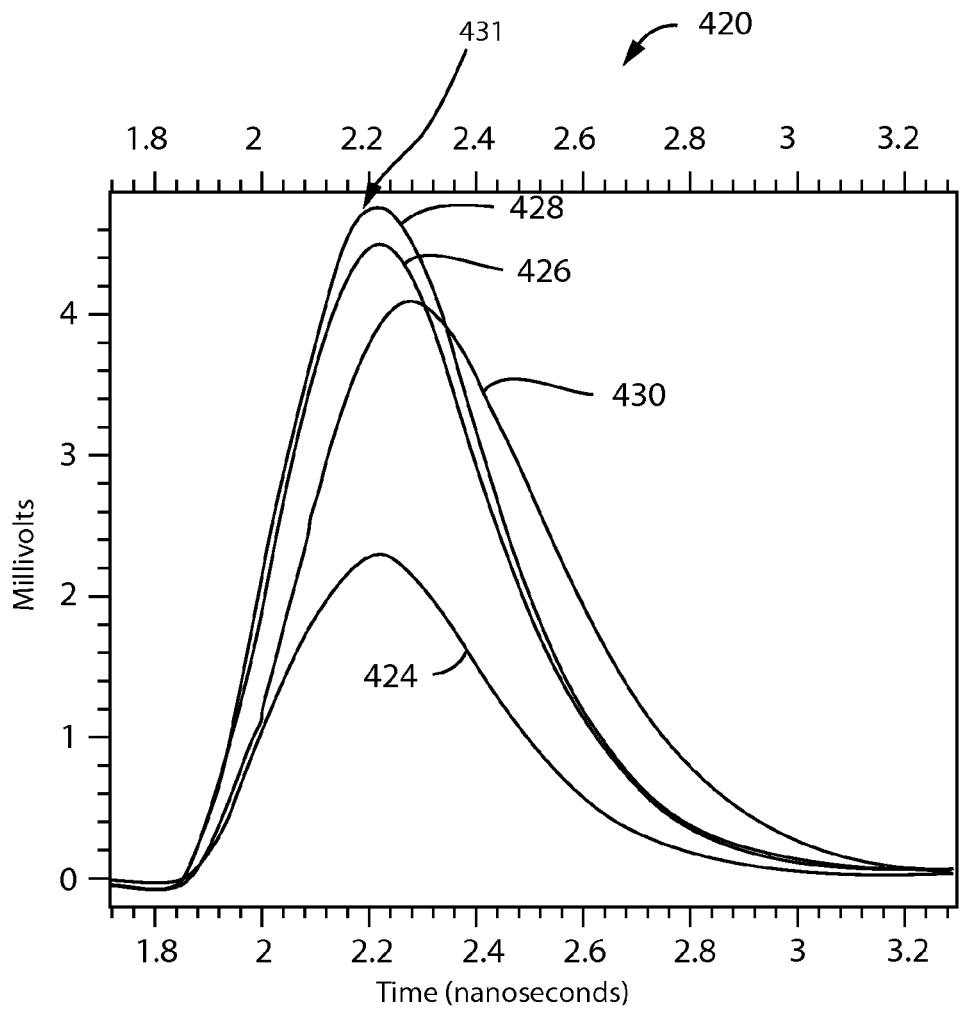
FIGS. 4B and 4C are graphical representations of the results of a timing analysis, in accordance with an embodiment.
Figure 4C:
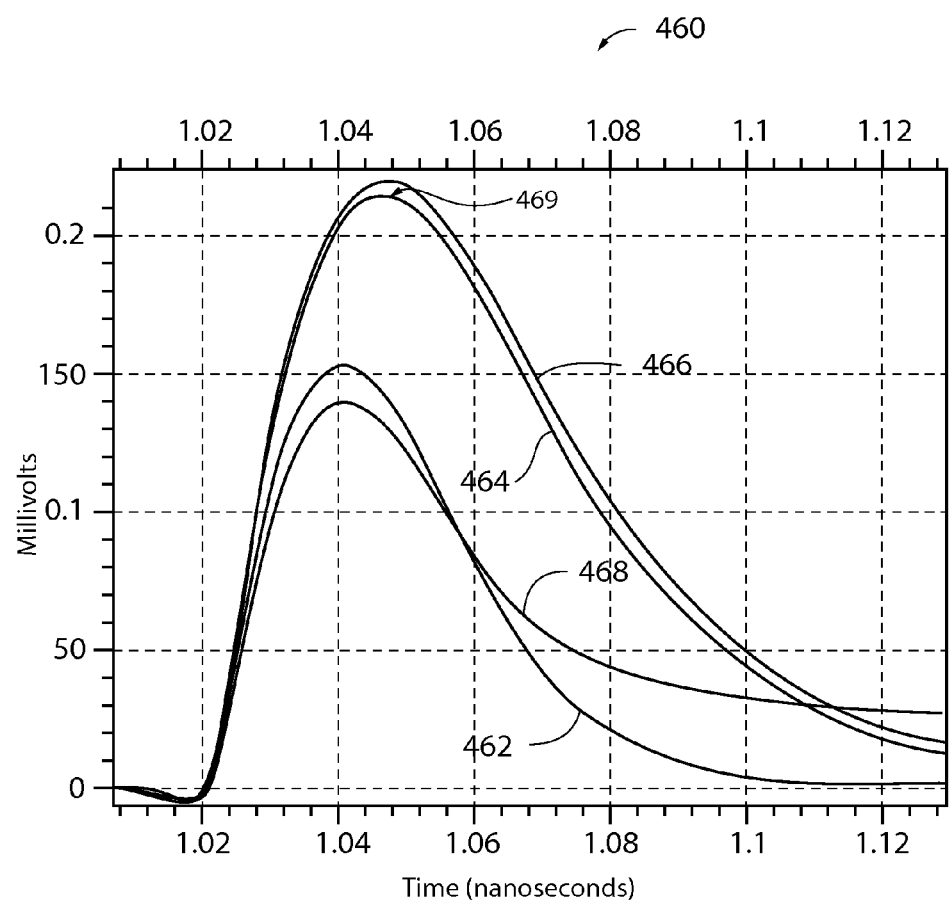
Figure 5:
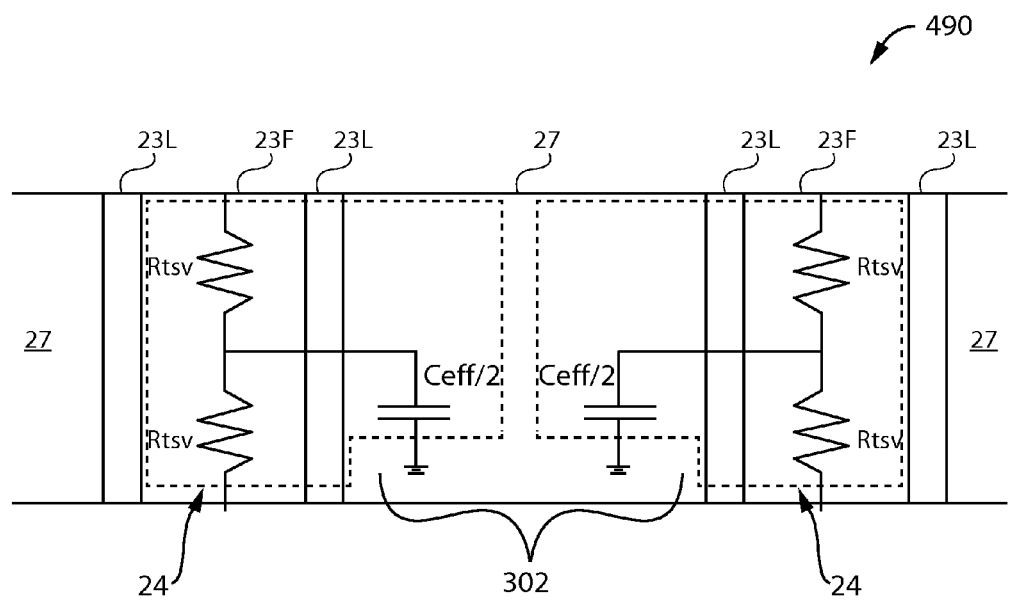
FIG. 5 is an alternative embodiment of a TSV-to-TSV coupling model that is generated and used by the system shown in FIG. 2, in accordance with an embodiment.
Figure 6:
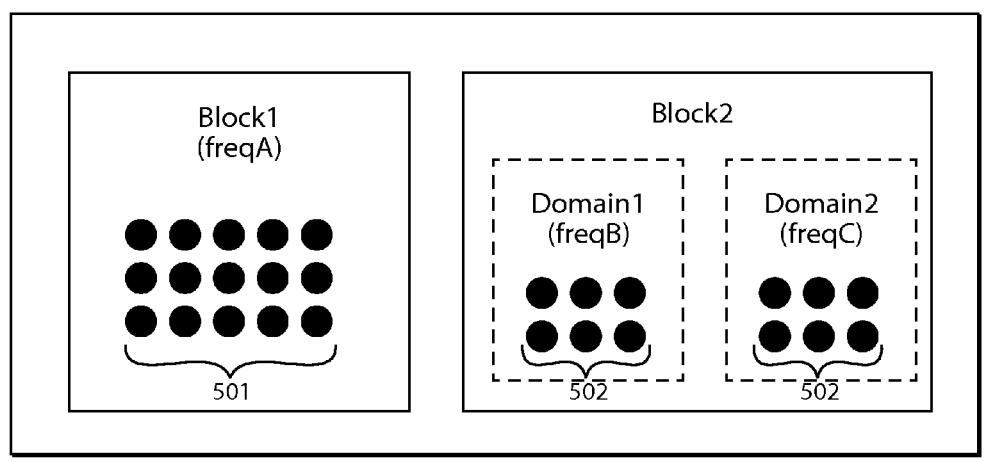
FIG. 6 is a block diagram of a grouping model that can be used by the system shown in FIG. 2, in accordance with an embodiment.

FIG. 2 illustrates a system 100 that is used to design 3D IC 20 in FIG. 1 and to make various determinations regarding 3D IC 20, such as performing a timing analysis for the design of the 3D IC 20. FIG. 3A is an embodiment of a TSV-to-TSV coupling model 300 that is generated and used by system 100. FIGS. 3B and 3C include embodiments of TSV-to-TSV coupling models 320, and 330, respectively, that are each modifications of model 300 shown in FIG. 3A, and models 320 and 330 are generated and used by system 100. FIG. 4A is a graphical representation of an impedance profile 400 related to FIG. 3A that is generated and used by system 100. FIGS. 4B and 4C are graphical outputs 420 and 460, respectively, of the results of a timing analysis of an RC network that is based on FIG. 3C. FIG. 5 is an alternative embodiment of a TSV-to-TSV coupling model 490 that is a modification of model 300 shown in FIG. 3A and can be generated and used by system 100 in place of models 320 and/or 330 shown in FIGS. 3B and 3C, respectively. FIG. 6 is a block diagram of a grouping model that can be used by system 100.

Referring to FIG. 2, system 100 can be a physical computer system or host that includes a user interface 104 that receives at least one input from a user, such as a designer of 3D IC 20. In some embodiments, user interface 104 includes a keyboard 106 that enables the user to input pertinent information. Alternatively, user interface 104 can include, for example, a pointing device, a mouse, a stylus, a touch sensitive panel (e.g., a touch pad or a touch screen), a gyroscope, an accelerometer, a position detector, and/or an audio input interface (e.g., including a microphone).

Moreover, in some embodiments, system 100 includes a presentation interface 107 that presents information, such as input events and/or validation results, to the user. For example, presentation interface 107 includes a display adapter 108 that is coupled to at least one display device 110. Display device 110 can be a visual display device, such as a cathode ray tube ("CRT"), a liquid crystal display ("LCD"), an organic LED ("OLED") display, and/or an "electronic ink" display. Alternatively, presentation interface 107 can include an audio output device (e.g., an audio adapter and/or a speaker) and/or a printer.

System 100 also includes a central processor 114 and at least one non-transitory, computer readable storage medium, such as a memory device 118. Processor 114 is coupled to user interface 104, presentation interface 107, and to memory device 118 via a system bus 120. In some embodiments, processor 114 communicates with the user, such as by prompting the user via presentation interface 107 and/or by receiving user inputs via user interface 104.

In some embodiments, processor 114 is programmed by encoding an operation using one or more executable instructions and by providing the executable instructions in memory device 118. The term "processor" refers generally to any programmable system including systems and microcontrollers, reduced instruction set circuits ("RISC"), application specific integrated circuits ("ASIC"), programmable logic circuits ("PLC"), and any other circuit or processor capable of executing the functions described herein. This description is not intended to limit in any way the definition and/or meaning of the term "processor."

In some embodiments, memory device 118 includes one or more devices that enable information, such as executable instructions and/or other data, to be stored and retrieved. Moreover, in some embodiments, memory device 118 includes one or more computer readable media, such as, without limitation, dynamic random access memory ("DRAM"), static random access memory ("SRAM"), a solid state disk, and/or a hard disk. In some embodiments, memory device 118 stores, without limitation, application source code, application object code, configuration data, additional input events, application states, assertion statements, validation results, and/or any other type of data.

Included within processor 114 is an electronic design automation ("EDA") tool 123. An RC extraction tool 124 and an STA tool 126 are each included within EDA tool 123. EDA tool 123, RC extraction tool 124, and STA tool 126 each include one or more software modules that are executed within processor 114. In one embodiment, EDA tool 123 can include software, such as "IC COMPILER"™, sold by Synopsis, Inc. of Mountain View, Calif., which can include a place and route tool (not shown), such as "ZROUTE"™, also sold by Synopsys, Inc. Other EDA tools 123 can be used, such as the "VIRTUOSO" custom design platform (not shown) or the Cadence "ENCOUNTER"® digital IC design platform (not shown), along with the "VIRTUOSO" chip assembly router (not shown), all sold by Cadence Design Systems, Inc. of San Jose, Calif.

System 100 also includes a communication interface 130 that is coupled to processor 114 via system bus 120. Moreover, communication interface 130 can be coupled to, for example, a remote terminal (not shown), such as a desktop computer, laptop, mobile device, thin client, or other similar device. As such, the remote terminal can be capable of displaying applications running inside system 100 to an end user using the remote terminal.

During operation of system 100, as explained in more detail below with respect to FIG. 7, system 100 facilitates a full-chip timing analysis by STA tool 126 by using a reduced or simplified design model of a coupling between at least two TSVs 23 of 3D IC 20. For example, in some embodiments, referring to FIG. 3A, EDA tool 123 generates a network model 300, which may also be referred to as a lumped parameter model, wherein network model 300 is representative of at least two TSVs 23 of 3D IC 20.

FIG. 3A, shows a schematic view of the lumped parameter network model 300 superimposed on a cross sectional view of a modeled substrate 27 having two TSVs 23 therein. In the example, the substrate 27 has only two TSVs 23, solely for brevity and ease of explanation. Other examples can have more than two TSVs 23. The TSVs 23 are separated by a pitch 290, with substrate material 27 therebetween. Each TSV 23 includes a respective liner layer 23L and a respective conductive bulk fill material 23F within the liner layer 23L, the bulk fill material 23F extending through the substrate 27. In some embodiments, the liner layer comprises Ti, TiN, Ta or TaN. In some embodiments, the conductive bulk fill comprises copper.

The lumped parameter model 300 models the out-of-plane resistance of the TSV 23 as two series connected resistors, each having a resistance Rtsv. The in-plane (radial direction) capacitance of the liner layer 23L is modeled by a capacitor (between the conductive fill layer 23F and the substrate 27)

having capacitance Ctsv. The capacitor having capacitance Ctsv is modeled as being connected to a node between the two resistances Rtsv. The impedance of the substrate material 27 between the two TSVs is modeled by a coupling channel 302, including an in-plane resistance Rsub in parallel with an in-plane capacitance Csub. In the model, the coupling channel 302 is connected in series between the two capacitances Ctsv.

In addition to including the two TSVs 23, network model 300 includes a coupling channel 302 between the TSVs 23, wherein the coupling channel 302 is a lumped parameter model of the complex impedance of the substrate between two adjacent TSVs. For example, in some embodiments, the coupling channel is a lumped parameter model of a silicon substrate. Network model 300 also includes various lumped parameter models of spatially distributed impedance elements, arranged in a topology including discrete entities that approximate the behavior of the parasitic elements of the TSV 23 and 3D IC 20. For example, in some embodiments, the parasitic elements include the parasitic resistance (Rtsv) within each TSV 23, the parasitic resistance of the substrate (Rsub), the parasitic capacitance (Ctsv) of the respective liner layer surrounding each TSV 23, and the parasitic capacitance of the substrate (Csub). Each of these parasitic elements can cause delays in a signal being transmitted from, for example, top die 25 (shown in FIG. 1) to bottom die 30 (shown in FIG. 1).

In some embodiments, network model 300 is modified prior to an RC extraction such that a full-chip timing analysis can be supported by STA tool 126. For example, referring to FIG. 3B, EDA tool 123 reduces network model 300 of FIG. 3A to an intermediate model 320 having a three capacitors disposed in series, such as Ctsv, Ceff, and Ctsv, wherein Ceff is the effective capacitance of channel 302.

FIG. 3B, shows a schematic view of the intermediate network model 320 superimposed on a cross sectional view of a modeled substrate 27 having two TSVs 23 therein. In the example, the substrate 27 has only two TSVs 23, solely for brevity and ease of explanation. Other examples can have more than two TSVs 23. The cross-sectional view of FIG. 3B is the same as the cross-sectional view of FIG. 3A. However, the intermediate model 320 in FIG. 3B has a simplified model of the coupling channel 302, different from that discussed above with reference to FIG. 3A.

In FIG. 3B, the intermediate model 320 models the out-of-plane resistance of the TSV 23 as two series connected resistors, each having a resistance Rtsv. The in-plane (radial direction) capacitance of the liner layer 23L is modeled by a capacitor (between the conductive fill layer 23F and the substrate 27) having capacitance Ctsv. The capacitor having capacitance Ctsv is modeled as being connected to a node between the two resistances Rtsv. The impedance of the substrate material 27 between the two TSVs is modeled by a coupling channel 302, including an in-plane effective capacitance Ceff connected in series between the two capacitances Ctsv. In some embodiments, Ceff is selected so that the magnitude of the impedance of the coupling channel 302 of intermediate model 320 (FIG. 3B) is the same as the magnitude of the impedance of the coupling channel 302 of model 300 (FIG. 3A).

Referring to FIG. 3C, intermediate model 320 is then reduced to a simplified model 330 to facilitate the determination of a single effective capacitance value Ceff'. For example, in some embodiments, Ctsv, Ceff, and Ctsv of model 320 are combined to form Ceff' of model 330. FIG. 3C, shows a schematic view of the simplified model 330 superimposed on a cross sectional view of a modeled substrate 27 having two TSVs 23 therein. In the example, the substrate 27 has only two TSVs 23, solely for brevity and ease of explanation. Other examples can have more than two TSVs 23. The cross-sectional view of FIG. 3C is the same as the cross-sectional view of FIG. 3B. However, the simplified model 330 in FIG. 3C has a simplified model of the capacitance between TSVs, different from that discussed above with reference to FIG. 3B.

In FIG. 3C, the simplified model 330 models the out-of-plane resistance of the TSV 23 as two series connected resistors, each having a resistance Rtsv. The in-plane (radial direction) capacitance of the liner layer 23L and the in-plane capacitance of the substrate 27 are modeled by a single capacitor having capacitance Ceff'. The capacitor having capacitance Ceff' is modeled as being connected to the nodes between the respective pairs of resistances Rtsv of each TSV 23. In some embodiments, Ceff' is selected so that the magnitude of the impedance of the coupling channel 302 of simplified model 330 (FIG. 3C) is the same as the magnitude of the impedance of three series connected capacitors having respective capacitances Ctsv, Ceff and Ctsv (as shown in intermediate model 320 of FIG. 3B).

As explained in more detail below with respect to FIG. 7, the reductions can be made by following various steps. For example, as shown in FIG. 4A, an impedance profile 400 that includes a plurality of impedance magnitude values as a function of frequency can be generated using model 300. In some embodiments, for impedance profile 400, the X-axis includes the frequency in Gigahertz (GHz, labeled as G for simplicity) at which the effective capacitance is calculated and the Y-axis is the measured magnitude of the complex impedance (including resistance and reactance components). An effective capacitance value, such as Ceff=a (shown in FIG. 4A) and Ceff=b (shown in FIG. 4A), can be determined by identifying the matching or corresponding impedance value from impedance profile 400. In some embodiments, the effective capacitance value can be determined for each of the different parameter values, such as the different frequency values shown in FIG. 4A. For example, an effective capacitance value, such as Ceff=a, is determined at a frequency 1 G and at a magnitude of 1.175 k (shown in FIG. 4A). Similarly, Ceff=b is determined at a frequency 2 G and at a magnitude of 1.04 k. In some embodiments, the effective capacitance value can be determined for the various different distances between the TSVs 23, such as distance 290 (shown in FIGS. 3A-3C) (i.e., TSV spacing values (μm)).

As explained in more detail below with respect to FIG. 7, network model 300 can be modified to an alternative model in place of intermediate model 320 and/or simplified model 330. For example, in some embodiments, referring to FIG. 5, network model 300 (shown in FIG. 3A) can be reduced by omitting the coupling-noise component between TSVs 24, to an alternative simplified model 490 that may be used in place of simplified model 330.

FIG. 5, shows a schematic view of the alternative simplified model 490 superimposed on a cross sectional view of a modeled substrate 27 having two TSVs 23 therein. In the example, the substrate 27 has only two TSVs 24, solely for brevity and ease of explanation. Other examples can have more than two TSVs 24. The cross-sectional view of FIG. 5 is the same as the cross-sectional view of FIG. 3C. However, in the alternative simplified model 490 in FIG. 5, the TSVs 24 are not considered to have a capacitive coupling, so that the coupling noise between the TSVs 24 is neglected.

In FIG. 5, the alternative simplified model 490 models the out-of-plane resistance of the TSV 24 as two series connected resistors, each having a resistance Rtsv. Each TSV 24 is modeled as having a capacitive coupling to ground (and not to each other). These capacitive coupling to ground for each TSV is modeled by a respective capacitor have capacitance Ceff/2 connected to the node between the pair of resistances Rtsv of each TSV 24. In some embodiments, Ceff/2' is selected so that the magnitude of the impedance between TSV 24 and ground in the alternative simplified model 490 (FIG. 5) is one half the magnitude of the impedance of three series connected capacitors having respective capacitances Ctsv, Ceff and Ctsv (as shown in intermediate model 320 of FIG. 3B).

For the generation of alternative simplified model 490, network model 300 is reduced such that the parasitic resistance (Rtsv) within each TSV 24, the parasitic resistance (Rsub) of the substrate, the parasitic capacitance (Ctsv) of the liner layer surrounding each TSV 24, and the parasitic capacitance (Csub) of the substrate is reduced to an effective capacitance value, Ceff, which is divided equally between the TSVs 24. Thus, for example, each TSV 24 is assigned an effective capacitance equal to Ceff/2 for each TSV 24.

An RC extraction of a design layout of 3D IC 20 is performed based on a simplified model, such as simplified model 330 and the determined effective capacitance value(s) to generate an RC network. In some embodiments, as explained in more detail with respect to FIG. 7, the RC extraction can be dependent on the different frequencies at which an effective capacitance is measured. For example, referring to FIG. 6, since effective capacitance varies with frequency, different effective capacitance values will result at the different frequencies that are being measured. In FIG. 6, the black dots 501-503 represent different frequency points within a block or a domain. Put another way, the black dots 501-503 represent different locations within the blocks at which frequency extraction is performed. In some embodiments, these locations correspond to the location of vias. For example, the black dots 501 within Block1 represent the locations at which different frequency extraction is performed using a first frequency, e.g., freqA. The frequency extraction of Block2 is performed using two different frequencies, e.g., freqB and freqC, which respectively correspond to Domain1 and Domain2. The black dots 502 within Block2 represent the locations at which different frequency extraction is performed using frequency B, and the black dots 503 within Block2 represent the locations at which different frequency extraction is performed using frequency C. In some embodiments, different extraction frequencies can also be assigned to different geometric regions or die, such as different regions of the IC 20 (shown in FIG. 1). For example, not only does effective capacitance vary with frequency, but it can also vary with frequency based on the location within the IC 20. In one example, as shown in FIG. 1, a first frequency is assigned to a first region 31, and a second frequency is assigned to a second region 32. For example, in some embodiments, region 31 has a high TSV density, and region 32 has a lower TSV density than region 31. This is just by way of example, and does not limit the assignment of different frequencies to respectively different regions or dies. As such, the RC extraction can be done at different frequency values that are from different locations of the IC 20, such as from blocks 1 and 2 that represent two different locations from within the IC 20. For example, in some embodiments, Blocks 1 and 2 are representative of two different geographic regions 31, 32 between the TSV-to-TSV coupling shown in FIGS. 3A to 3C.

The RC network can then be used, by STA tool 126, for a timing analysis to determine the timing of a signal, such as an input signal 45 (shown in FIG. 1), traveling from top die 25 (shown in FIG. 1) to bottom die 30 (shown in FIG. 1) of IC 20 (shown in FIG. 1). In some embodiments, the RC network can be used to determine the timing of a signal traveling within the entire IC 20 (i.e., full-chip timing analysis). An output representative of the results of the timing analysis can be generated and displayed to a user using display device 110. In some embodiments, the output may be a graphical output, such as output 420 shown in FIG. 4B and output 460 shown in FIG. 4C, as explained in more detail below.

Figure 7:
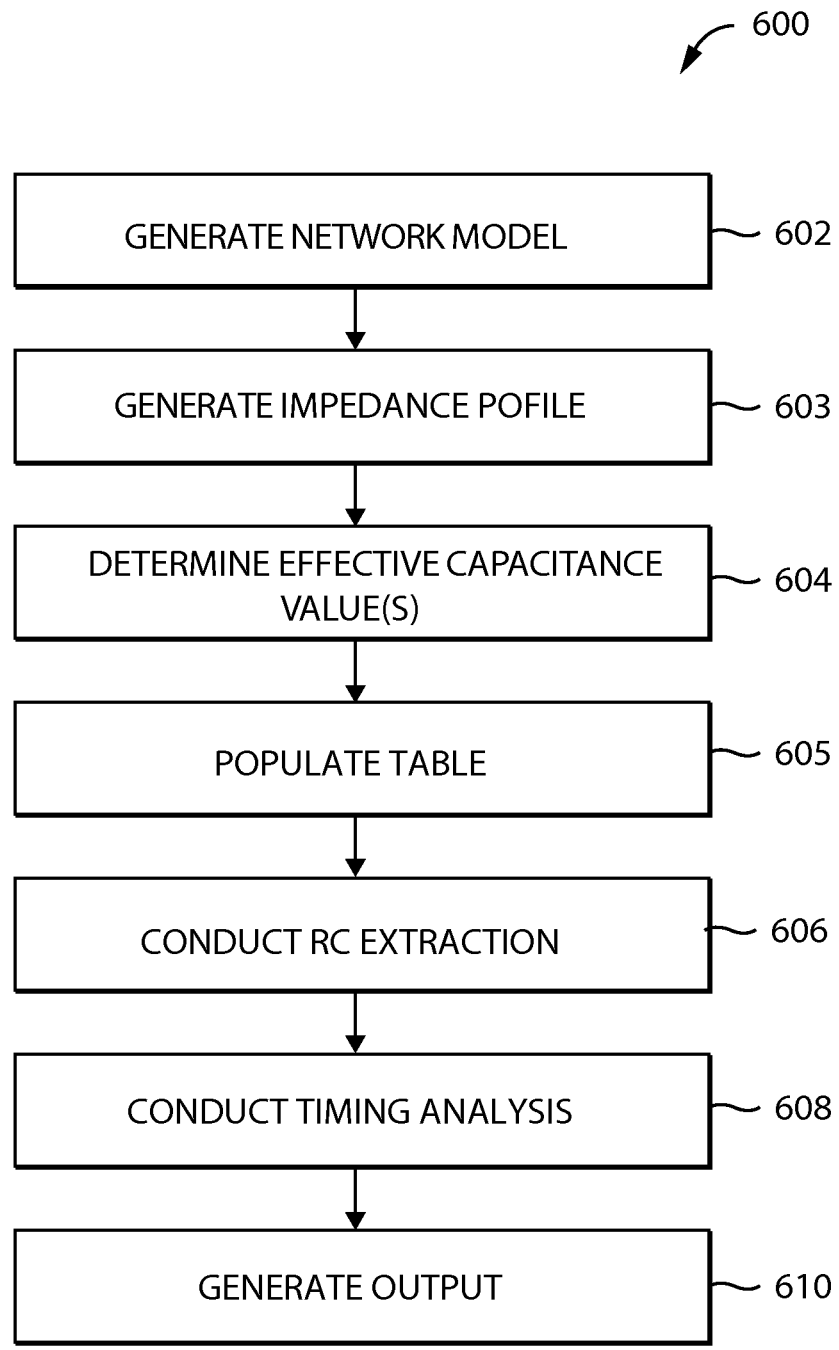
FIG. 7 is a flow diagram of a method for determining effective capacitance value(s) that are used to facilitate a timing analysis by the system shown in FIG. 2, in accordance with an embodiment.

FIG. 7 is a flow diagram 600 of a method for determining effective capacitance value(s) that are used to facilitate a timing analysis using system 100 (shown in FIG. 2). In step 602, a network model, such as model 300 (shown in FIG. 3A), that is representative of a coupling between at least two TSVs 23 (shown in FIG. 1 and FIGS. 3A-3C) of 3D IC 20 (shown in FIG. 1) is generated. In addition to including the two TSVs 23, network model 300 includes coupling channel 302 (shown in FIGS. 3A-3C) between the TSVs 23 and includes the various parasitic elements, such as the parasitic resistance (Rtsv and Rsub) and the parasitic capacitance (Ctsv and Csub), that would cause delays in a signal being transmitted from, for example, top die 25 (shown in FIG. 1) to bottom die 30 (shown in FIG. 1).

As discussed above, in some embodiments, network model 300 is modified prior to an RC extraction such that a full-chip timing analysis can be supported by STA tool 126. For example, network model 300 is reduced to intermediate model 320 (shown in FIG. 3B) having a three series capacitance, and model 320 is subsequently reduced to simplified model 330 (shown in FIG. 3C) such that the three series capacitance becomes an effective capacitance (Ceff). The reductions can be made by the following steps. For example, in step 603, an impedance profile 400 (shown in FIG. 4A) that includes a plurality of impedance values as a function of frequency is generated using network model 300. For each frequency value, the impedance expressed in the complex domain that includes a magnitude and a phase angle for the coupling channel 302 is measured, and an effective capacitance value is calculated having the same magnitude as the magnitude of the complex impedance with a phase angle. In some embodiments, the phase angle can be -90 degrees. In some embodiments, impedance profile 400 includes impedance values of the resistance and capacitance network that are determined or measured between the two TSVs 23, wherein the impedance values vary as a function of different parameter values, such as different frequency values and/or different TSV spacing values (μm). In some embodiments, impedance profile 400 is displayed by a graphical representation that includes magnitude (Y-axis) vs. frequency (X-axis). In step 604, an effective capacitance value, such as Ceff=a (shown in FIG. 4A) and Ceff=b (shown in FIG. 4A), is determined by identifying the matching or corresponding impedance value from impedance profile 400. For example, in some embodiments, the effective capacitance value can be determined for each of the different parameter values, such as different frequency values (shown in FIG. 4A). In some embodiments, the capacitance value can be determined for different TSV spacing values (μm) (i.e., the various different distances between the TSVs 23, such as distance 290 (shown in FIGS. 3A-3C)). For example, an effective capacitance value 401, such as Ceff=a, can be determined at a frequency 1 G and at a magnitude of 1.175 k (shown in FIG. 4A). Similarly, a value 402 of Ceff=b can be determined at a frequency 2 G and at a magnitude of 1.04 k in some embodiments. In step 605, a table, such as Table 1 below, is populated, and the table includes each of the determined effective capacitance values, such as Ceff=a and Ceff=b. In Table 1, the frequency is in Gigahertz (G) at which the effective capacitance is calculated and the TSV spacing (i.e., distance between two TSVs 23, such as distance 290 (shown in FIGS. 3A-3C), is in micrometers (μm).

TABLE 1

Determined effective Capacitance Values at different frequencies and TSV spacing

| TSV Spacing (μm) | Frequency (G) | | |
|---|---|---|---|
| | 1 G | 2 G | ... |
| 68 | Ceff = a | Ceff = b | |
| 100 | | | |
| ... | | | |

In some embodiments, rather than using one table, multiple tables can be used. For example, a plurality of tables similar to Table 1 can be populated having effective capacitance values at different frequencies and TSV spacing values. When using multiple tables, each of the tables can include different frequency ranges or TSV spacing value ranges.

In step 606, an RC extraction of a design layout of a TSV circuit, such as IC 20 (shown in FIG. 1), based on the populated Table 1 is conducted to generate an RC network. In some embodiments, the design layout of the TSV circuit can be provided by the user. For example, the user may input the layout to system 100 such that the layout is saved in memory device 118 (shown in FIG. 2) until the layout is used during step 606. When conducting the RC extraction of the design layout, the determined effective capacitance values from Table 1 are used. In other embodiments, network model 300 (FIG. 3A) can be reduced by omitting the coupling-noise component between TSVs, to an alternative simplified model 490 (shown in FIG. 5) that may be used in place of simplified model 330. For the generation of simplified model 490, network model 300 is reduced such that the parasitic resistance (Rtsv) within each TSV 23, the parasitic resistance (Rsub) of the substrate, the parasitic capacitance (Ctsv) within each TSV 23, and the parasitic capacitance (Csub) of the substrate is reduced to an effective capacitance/2 (Ceff/2) for each TSV 23. For example, network model 300 can be reduced to an intermediate model (not shown) having an X series capacitance, and the intermediate model can be subsequently reduced to simplified model 490. In such an alternative embodiment, the Ceff lumped capacitance (shown in FIG. 3C) is no longer used and is replaced by individual capacitances (Ceff/2), between each respective TSV and ground.

In some embodiments, the RC extraction in step 606 is frequency dependent. For example, different frequencies result in different effective capacitance values and, different extraction frequencies can be assigned to different geometric regions or die, such as different regions of the IC (i.e., Blocks 1 and 2 shown in FIG. 6 can correspond to regions 31 and 32 shown in FIG. 1). For example, not only does effective capacitance vary with frequency, but it can also vary with frequency based on the location within the IC 20. As such, the RC extraction can be done at different frequency values that are from different locations of the IC 20, such as from Blocks 1 and 2 that represent two different locations from within the IC 20. For example, in some embodiments, Blocks 1 and 2 are representative of two different geographic regions between the TSV-to-TSV coupling (shown in FIGS. 3A to 3C). In some embodiments, when the various frequencies for each of the Blocks 1 and 2 are determined, a single table, similar to Table 1, can be generated, wherein the table identifies each frequency value and the respective geographic region in Blocks 1 and/or 2. Such a table can be used for the RC extraction. Alternatively, in some embodiments, multiple tables that include more geographic regions and their respective frequencies can be used for the RC extraction.

In other embodiments, different extraction frequencies can be assigned to different signals, such as signals transmitted at difference frequencies (i.e., frequencyA, frequencyB, and frequencyC shown in FIG. 6). Accordingly, in some embodiments, when an RC extraction is being conducted of the design layout in step 606, the RC extraction is based on the populated table, such as Table 1, using the effective capacitance values that are assigned to different geometric regions. For example, when using Table 1, Ceff is a function of frequency and TSV distance, as shown in Equation 1 below.

$$Ceff=F(\text{frequency},\text{TSV distance}) \quad \text{Eq. 1}$$

As such, Block 1 (shown in FIG. 6) can be assigned to a frequency, such as, for example, 1 G, and TSV distance is based on the design layout of a TSV circuit. Block 2 (shown in FIG. 6) and Domain 1 (shown in FIG. 6) can be assigned to a different frequency, such as, for example, 2 G, and the TSV distance is based on the design layout of the TSV circuit. When using multiple tables, Ceff is a function of frequency, TSV distance, and the table being used, as shown in Equation 2 below.

$$Ceff=F(\text{frequency},\text{TSV distance},\text{Table}) \quad \text{Eq. 2}$$

As such, in some embodiments, Block 1 is assigned to a frequency of 100 Megahertz (MHz or M for simplicity) and the TSV distance is based on the design layout of the TSV circuit. In some embodiments, Block 2 and Domain 1 is assigned to a frequency of 5 G and the TSV distance is based on the design layout of the TSV circuit. In other embodiments, the RC extraction is based on the populated table, such as Table 1, using the determined effective capacitance values.

After the RC network is generated, then, in step 608, a timing analysis, such as a static timing analysis, is conducted by STA tool 126 using the RC network. In some embodiments, a timing analysis accounting for coupling-noise is conducted using the RC network generated in step 606. In some embodiments, the timing analysis is conducted to determine the timing of a signal, such as an input signal 45 (shown in FIG. 1), traveling from top die 25 (shown in FIG. 1) to bottom die 30 (shown in FIG. 1) of IC 20 (shown in FIG. 1). In some embodiments, the RC network can be used to determine the timing of a signal traveling within the entire IC 20 (i.e., full-chip timing analysis). When conducting the timing analysis, the determined effective capacitance values from Table 1 are used. In other embodiments, a timing analysis is conducted using the simplified TSV model 490 described above with reference to FIG. 5 (without accounting for coupling-noise). This timing analysis uses the RC network generated in step 606, wherein the predefined capacitance values that are approximately half of each of the effective capacitance values based on model 490 in FIG. 5 are used.

In step 610, an output representative of the results of the timing analysis is generated and displayed to a user using display device 110 shown in FIG. 1. In some embodiments, the output may be a graphical output, such as output 420 shown in FIG. 4B and output 460 shown in FIG. 4C initially described above. Output 420 is generated based on measuring a TSV coupling noise within an area, such as within distance 290 (shown in FIGS. 3A-3C) between the TSV-to-TSV coupling. For example, in some embodiments, output 420 is based on a TSV coupling noise at a location that is spaced at a distance from another TSV. In the example illustrated in FIG. 4C, the spacing between TSVs was 68 μm. A signal is transmitted through, for example, an I/O cell driver and the signal travels at a speed that is less than approximately 100 MHz. Output 420 illustrates curves 424, 426, 428, and 430 that are representative of the velocity of the signal(s) based on different effective capacitance values and/or a resistance/capacitance value. In output 420, the unit for the x-axis is time in nanoseconds and the unit for the y-axis is voltage in millivolts. In some embodiments, curve 424 represents the velocity of the signal at point 401 (FIG. 4A) based on an effective capacitance value of "a" that is determined above, while curve 426 represents the velocity of the signal at point 402 (FIG. 4A) based on an effective capacitance value of "b" that is determined above. In some embodiments, "a" can is an effective capacitance corresponding to 2.5 G and "b" is an effective capacitance corresponding to 100 MHz. Curve 428 represents the velocity of the signal at point 403 (FIG. 4A) based on an effective capacitance value of "c", wherein "c" is an effective capacitance corresponding to 1 MHz as shown by point 403 in FIG. 4A. Curve 430 represents the velocity of the signal being transmitted through a model, such as network model 300, to identify how the resistance and/or capacitance within network model 300 impacts the signal travel time. In some embodiments, the resistance and/or capacitance for network model 300 can cause a low frequency signal. The waveform predicted by the analysis described above was compared to silicon data. When the signal frequency is low, the model's predictions more accurately match the actual timing behavior, if the model includes a low frequency effective capacitance value. For example, both the rise time and voltage peak predicted by the model matches actual circuit performance better when the model includes a low frequency effective capacitance value. Conversely, when the signal frequency is low, the model's predicted timing behavior deviates more from actual circuit performance if the model includes a high frequency effective capacitance. Such deviations are due to the existence of second order effects which are not included in the simplified lumped parameter models described herein. These second order effects can be neglected with little loss of accuracy for low frequency signals, if the model includes low effective capacitance values.

Output 460 is an example of another output that can be generated based on measuring a TSV coupling noise at a target, such as within distance 290 between the TSV-to-TSV coupling. For example, in some embodiments, output 460 is based on a TSV coupling noise at a target having a 68 μm spacing. A signal is transmitted through a buffer cell driver at a relatively fast speed. The difference between output 460 and output 420 is that each output shows a timing analysis for different circuits that are operating under different conditions. For example, as discussed above, output 420 relates to a signal transmitted through the I/O cell driver and output 460 relates to a signal transmitted through the buffer driver. In output 460, the unit for the x-axis is time in nanoseconds and the unit for the y-axis is voltage in millivolts. Output 460 illustrates curves 462, 464, 466, and 468 that are representative of the velocity of the signals based on different effective capacitance values and/or a resistance/capacitance value. For example, in some embodiments, curve 462 represents the velocity of the signal being transmitted through network model 300. Curve 464 represents the velocity of the signal based on an effective capacitance value of "a" that is determined above, while curve 466 represents the velocity of the signal based on an effective capacitance value of "b" that is determined above. In some embodiments, "a" can be equal to 100 MHz and "b" can be equal to 1 MHz. Curve 468 represents the velocity of the signal at point 404 (FIG. 4A) based on an effective capacitance value of "d", wherein "d" is an effective capacitance corresponding to 2.5 GHz. In some embodiments, the resistance/capacitance for network model 300 causes a high frequency signal. The signal propagates through the buffer cell faster than the I/O cell. When the signal frequency is high, the model's predictions more accurately predict the timing behavior of the actual circuit performance, if the model includes a high frequency effective capacitance value. For example, for high frequency signals, the model's predictions of both rise time and voltage peak more accurately match actual circuit performance, if the model includes a high frequency effective capacitance value. Conversely, for high frequency signals, the model's predictions of timing behavior deviate more from actual circuit performance if a low frequency effective capacitance is used. Such deviations are due to the existence of second order effects which are not included in the simplified lumped parameter models described herein. These second order effects can be neglected with little loss of accuracy for high frequency signals, if the model includes high effective capacitance values.

As compared to other modeling and simulation techniques for ICs, the embodiments of the system and method described herein facilitate a full-chip timing analysis by an STA tool by using a modified design model of a coupling between at least two TSVs of a 3D IC. For example, in some embodiments, a TSV-to-TSV coupling model 300 including the coupling channel 302 (FIG. 3A) that is representative of a coupling between at least two TSVs 23 of a 3D IC package is generated. However, because the STA tool can only facilitate a more restricted network style, a timing analysis, such as a full-chip timing analysis, using the network model cannot be performed by the STA tool. As such, the TSV-to-TSV coupling model 300 in various embodiments of the present disclosure is modified prior to an RC extraction such that the full-chip timing analysis can be supported by the STA tool. In some embodiments, the TSV-to-TSV coupling model 300 is reduced to a simplified model 320, 330 or 490 (as shown in FIGS. 3B, 3C and 5) such that effective capacitance values can be determined. An RC extraction is performed on a design layout of a TSV circuit based on the simplified model and the determined effective capacitance values. The results of the RC extraction can then be used for a full-chip timing analysis by the STA tool. By reducing or simplifying the TSV-to-TSV coupling model 300 such that a simplified model 320, 330 or 490 can be used for the determination of effective capacitance values, a full-chip timing analysis can be supported by the STA tool.

In some embodiments, a method for determining an effective capacitance to facilitate a timing analysis using a processor includes generating a model that is representative of a coupling between at least two TSVs. An impedance profile between the two TSVs as a function of at least one parameter is determined by using the model, wherein the impedance profile includes a plurality of impedance values corresponding to respective values of the parameter. An effective capacitance value corresponding to each respective impedance value is determined. An RC extraction is conducted of a design layout of a TSV circuit based on each determined effective capacitance value to generate an RC network. The RC network is used for a timing analysis.

In some embodiments, a system includes a non-transient machine readable storage medium storing a network model that is representative of a coupling between at least two TSVs generated by an EDA tool. An RC tool and an STA tool are each within the EDA tool such that EDA tool is configured to determine an impedance profile between the two TSVs as a function of at least one parameter by using the model, wherein the impedance profile includes a plurality of impedance values corresponding to respective values of the parameter. The EDA tool is further configured to determine an effective capacitance value corresponding to each respective impedance value and to populate at least one table that includes each of the determined effective capacitance values. The EDA tool is also configured to conduct an RC extraction of a design layout of a TSV circuit based on the populated table to generate an RC network and to use the RC network for a timing analysis.

In some embodiments, at least one non-transitory computer-readable storage medium having computer-executable instructions embodied thereon, wherein, when executed by at least one processor, the computer-executable instructions cause the processor to generate a model that is representative of a coupling between at least two TSVs and to determine an impedance profile between the two TSVs as a function of at least one parameter by using the model, wherein the impedance profile includes a plurality of impedance values corresponding to respective values of the parameter. The computer-executable instructions further cause the processor to determine an effective capacitance value corresponding to each respective impedance value and to save each of the determined effective capacitance values, wherein the saved determined effective capacitance values are accessible by the processor. The computer-executable instructions also cause the processor to conduct an RC extraction of a design layout of a TSV circuit based on the determined effective capacitance values to generate an RC network.

The methods described herein can be at least partially embodied in the form of computer-implemented processes and apparatus for practicing those processes. The disclosed methods can also be at least partially embodied in the form of computer program code embodied in tangible, non-transient machine readable storage media, such as RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods can also be at least partially embodied in the form of computer program code, whether loaded into and/or executed by a computer, such that, when the computer program code is loaded into and executed by a computer, the computer becomes an apparatus for practicing the methods. When implemented on a general-purpose processor, the computer program code segments configure the processor to create specific logic circuits. The methods can alternatively be at least partially embodied in a digital signal processor formed of application specific integrated circuits for performing the methods.

Although the system and method described herein have been described in terms of exemplary embodiments, they are not limited thereto. Rather, the appended claims should be construed broadly, to include other variants and embodiments of the disclosed system and method, which can be made by those skilled in the art without departing from the scope and range of equivalents of the system and method.

What is claimed is:

1. A method for timing analysis using a processor, comprising:
    generating a model that is representative of a coupling between at least two through substrate vias ("TSVs");
    determining an impedance profile between the at least two TSVs as a function of at least different frequency values by using the model, wherein the impedance profile includes a plurality of impedance values corresponding to respective frequency values;
    determining an effective capacitance value corresponding to each respective impedance value;
    populating at least one table with respective impedance values and respective effective capacitance values for each respective frequency value; and
    conducting an RC extraction of a design layout of a TSV circuit using the populated table and based on each determined effective capacitance value to generate an RC network.

2. The method of claim 1, wherein determining an impedance profile between the at least two TSVs comprises determining an impedance profile between the at least two TSVs as a function of different spacing values.

3. The method of claim 2, wherein determining an effective capacitance value comprises determining an effective capacitance value at each of the different spacing values.

4. The method of claim 1, wherein conducting an RC extraction comprises conducting an RC extraction of the design layout based on capacitance values that are approximately half of each of the effective capacitance values to generate the RC network.

5. The method of claim 4, wherein the model has each of the at least two TSVs coupled to ground by a respective capacitor having the capacitance values that are approximately half of each of the effective capacitance values.

6. The method of claim 5, wherein the model excludes a coupling noise between the at least two TSVs.

7. The method of claim 6, further comprising performing a full chip static timing analysis using the RC network.

8. The method of claim 1, wherein the effective capacitance values vary based on frequency and based on locations of TSVs within an IC.

9. The method of claim 1, wherein conducting an RC extraction comprises conducting an RC extraction of the design layout using respectively different effective capacitance values for TSVs assigned to different signal groups.

10. The method of claim 1, the RC extraction uses respectively different effective capacitance values for TSVs located in different regions of an IC having respectively different TSV densities.

11. A system comprising:
    a non-transient machine readable storage medium storing a model that is representative of a coupling between at least two through substrate vias ("TSVs") generated by an electronic design automation ("EDA") tool; and
    an RC tool and a static timing analysis ("STA") tool within the EDA tool such that the EDA tool is configured to:
        determine an impedance profile between the at least two TSVs as a function of at least different frequency values by using the model, wherein the impedance profile includes a plurality of impedance values corresponding to respective frequency values;
        determine an effective capacitance value corresponding to each respective impedance value;
        conduct an RC extraction of a design layout of a TSV circuit based on respective effective capacitance values to generate an RC network, where the effective capacitance values vary based on frequency and based on locations of TSVs within an IC; and
        use the RC network for a timing analysis.

12. The system of claim 11, wherein the EDA tool is configured to determine the effective capacitance value at each of the different frequency values and different spacing values.

13. The system of claim 11, wherein the EDA tool is configured to determine the impedance profile between the at least two TSVs as a function of different spacing values.

14. The system of claim 13, wherein the EDA tool is configured to determine the effective capacitance value at each of the different spacing values.

15. The system of claim 11, wherein the EDA tool is configured to conduct the RC extraction of the design layout using predefined capacitance values that are approximately half of each of the effective capacitance values.

16. The system of claim 11, wherein the EDA tool is configured to conduct the RC extraction of the design layout using respectively different effective capacitance values for TSVs located in different regions of an IC.

17. At least one non-transitory computer-readable storage medium having computer-executable instructions embodied thereon, wherein, when executed by at least one processor, the computer-executable instructions cause the at least one processor to:
  provide a model that is representative of a coupling between at least two through substrate vias ("TSVs");
  determine an impedance profile between the at least two TSVs as a function of at least different frequency values by using the model, wherein the impedance profile includes a plurality of impedance values corresponding to respective frequency values;
  determine an effective capacitance value corresponding to each respective impedance value;
  store at least one table with respective impedance values and respective effective capacitance values for each respective frequency value, the stored impedance values and effective capacitance values accessible by the at least one processor; and
  conduct an RC extraction of a design layout of a TSV circuit based on the effective capacitance values in the table to generate an RC network.

18. The at least one non-transitory computer-readable storage medium of claim 17, wherein the computer-executable instructions cause the at least one processor to determine the impedance profile between the at least two TSVs as a function of different frequency values and different spacing values.

19. The at least one non-transitory computer-readable storage medium of claim 18, wherein the computer-executable instructions cause the at least one processor to determine the effective capacitance value at each of the different frequency values and different spacing values.

20. The at least one non-transitory computer-readable storage medium of claim 17, wherein the computer-executable instructions further cause the at least one processor to use the RC network for a timing analysis.

\* \* \* \* \*